United States Patent [19]

Abernathey et al.

[11] Patent Number: 4,601,779
[45] Date of Patent: Jul. 22, 1986

[54] METHOD OF PRODUCING A THIN SILICON-ON-INSULATOR LAYER

[75] Inventors: John R. Abernathey, Jericho; Jerome B. Lasky, Essex Junction; Larry A. Nesbit, Williston, all of Vt.; Thomas O. Sedgwick, Briarcliff Manor; Scott Stiffler, Cortland, both of N.Y.

[73] Assignee: International Business Machines Corporation, Armonk, N.Y.

[21] Appl. No.: 747,746

[22] Filed: Jun. 24, 1985

[51] Int. Cl.⁴ .................. H01L 21/306; B44C 1/22; C03C 15/00; C03C 25/06
[52] U.S. Cl. .................. 156/628; 29/576 B; 29/576 E; 148/1.5; 148/175; 156/630; 156/633; 156/643; 156/646; 156/645; 156/657; 156/662; 204/192 E; 204/192 N; 252/79.1; 252/79.3; 252/79.5; 427/85; 427/86
[58] Field of Search .................. 29/571, 576 E, 576 B, 29/576 R; 148/1.5, 175; 204/192 EC, 192 E, 192 N; 427/85, 86, 93, 94, 95; 156/628, 630, 633, 643, 646, 645, 657, 662; 252/79.1, 79.3, 79.5

[56] References Cited

U.S. PATENT DOCUMENTS

| | | | |
|---|---|---|---|
| 3,425,878 | 2/1969 | Dersin et al. | 156/662 X |
| 3,721,593 | 3/1973 | Hays et al. | 156/628 |
| 3,976,511 | 8/1976 | Johnson | 156/628 X |
| 3,997,381 | 12/1976 | Wanlass | 156/657 X |
| 4,230,505 | 10/1980 | Wu et al. | 156/657 X |

Primary Examiner—William A. Powell
Attorney, Agent, or Firm—Mark F. Chadurjian

[57] ABSTRACT

A method of forming a thin silicon layer upon which semiconductor devices may be constructed. An epitaxial layer is grown on a silicon substrate, and oxygen or nitrogen ions are implanted into the epitaxial layer in order to form a buried etch-stop layer therein. An oxide layer is grown on the epitaxial layer, and is used to form a bond to a mechanical support wafer. The silicon substrate is removed using grinding and/or HNA, the upper portions of the epitaxy are removed using EDP, EPP or KOH, and the etch-stop is removed using a non-selective etch. The remaining portions of the epitaxy forms the thin silicon layer. Due to the uniformity of the implanted ions, the thin silicon layer has a very uniform thickness.

27 Claims, 6 Drawing Figures

METHOD OF PRODUCING A THIN SILICON-ON-INSULATOR LAYER

CROSS-REFERENCE TO RELATED APPLICATIONS

Reference is made to co-pending U.S. patent application, Ser. No. 625,758, filed June 28, 1984, entitled "Silicon-on-Insulator Transistors With a Shared Element", by Abernathey et al and assigned to the assignee of the present invention. This application discloses and claims a method of forming devices upon a silicon-on-insulator structure.

TECHNICAL FIELD

The present invention relates to a method of forming a silicon-on-insulator structure.

BACKGROUND ART

In the present era of very large scale integration (VLSI), in which the dimensions of transistors and other semiconductor structures are shrinking below one micrometer, a host of new problems must be addressed. In general, greater isolation is required between devices. For CMOS applications, this isolation must prevent latch-up. At the same time, this increased isolation must not be provided at the expense of available chip space.

Silicon-on-insulator technology appears to be a particularly promising method of addressing this problem. A general example of this technology is shown in the article by R. J. Lineback, "Buried Oxide Marks Route to SOI Chips", *Electronics Week*, Oct. 1, 1984, pp. 11-12. As shown in this article, oxygen ions are implanted into a bulk silicon to form a buried oxide layer therein. The implant is then annealed for two hours so that the portion of the silicon lying above the buried oxide is single-crystal silicon. The various semiconductor devices are then formed on the single-crystal layer. The underlying buried oxide provides isolation between adjacent devices.

More recently, a specific method of forming silicon-on-insulator structures has evolved, in which two silicon substrates are bonded together and one of the substrates is at least partially removed. An example of this method is disclosed in an article by M. Kimura et al, "Epitaxial Film Transfer Technique for Producing Single Crystal Si Film on an Insulating Substrate", *Applied Physics Letters*, Vol. 43, No. 3, Aug. 1, 1983. As described in this article, a first p+ substrate has a P− epitaxial layer grown thereon. A second substrate has a layer of oxide grown thereon. Both substrates are then coated with a glass, and the two substrates are bonded together using these glass layers. More specifically, the glass layers of the two substrates are pressed together and are heated to about 930° C. After the substrates are bonded together, the substrate having the epitaxial layer is removed, leaving behind the epitaxial layer on the bonded glass layers. The glass layers provide insulation. See also the article by Brock et al, "Fusing of Silicon Wafers", *IBM Technical Disclosure Bulletin*, Vol. 19, No. 9, February 1977, pp. 3405-3406, in which it is stated that "wafers may be fused together conveniently by forming a layer of silicon dioxide on each wafer, then placing the layers of silicon dioxide abutting each other, and heating, preferably in a steam atmosphere at a temperature in the order of 1050° C. for about one-half hour."

U.S. Pat. No. 4,142,925 (issued 3/3/79 to King et al) discloses a method of making a structure which includes an epitaxial layer, an insulator layer and a polished silicon layer. As shown in the front figure of the patent, an epitaxial layer is grown on an n+ silicon substrate. An insulator layer of $SiO_2$ is grown on the epitaxial layer, and the insulator is covered with a polysilicon support layer. The n+ silicon substrate is then removed, leaving the epitaxial layer atop the $SiO_2$ layer.

It has been found that the step of removing the silicon substrate without removing the underlaying epitaxial layer is facilitated if these two layers have different doping concentrations or are of different conductivity types. For example, if the substrate is p+ and the epitaxial layer is p− or n type, the substrate may be removed by etching in a 1:3:8 solution of hydroflouric, nitric and acetic ("HNA") acid.

A problem with the above process is that the HNA acid will etch to the p+/p− or p+/n junction, which does not occur at the actual physical interface of these two layers. For example, in order to form a final n epitaxial layer of 200 nm (nanometers) on a p+ substrate, an epitaxial layer of 1000-1200 nm must be deposited. This is because boron will out-diffuse from the substrate into the epitaxial layer, such that the p+/n junction actually occurs at a point approximately 800-1000 nm, respectively, above the physical interface between the substrate and the epitaxial layer.

Forming a 1000-1200 nm layer of epitaxy leads to another problem. Typically, when working in the nm range, the deposition tools used in the industry can deposit a layer with approximately plus or minus 5 percent error. Thus, if the original epitaxial layer is 1000 nm thick, the final epitaxial layer (i.e. after removal of the p+ substrate) will be approximately 250±50 nm thick. When the dopant concentration of the epitaxial layer is sufficiently low, the depletion regions of the channels of FETs subsequently formed on the epitaxial layer will extend to the bottom of the layer. Hence, the threshold voltages of these FETs are at least partially determined by the thickness of the epitaxial layer, such that the above variation in thickness would lead to an unacceptable variation in the threshold voltages of the FETs. Obviously, as the thickness of the epitaxial layer as initially deposited is increased, the resultant thickness variation increases. For example, if the initial epitaxial thickness is 2500 nm, its final thickness would be approximately 250±150 nm.

SUMMARY OF THE INVENTION

It is thus an object of the present invention to provide an improved silicon-on-insulator fabrication process.

It is another object of the invention to provide a silicon-on-insulator process by which the thickness of the final silicon layer is substantially uniform.

It is yet another object of the invention to provide an improved silicon-on-insulator fabrication process in which the etching of the final silicon layer may be more precisely controlled.

These and other objects of the invention are realized in a process of forming a relatively thin silicon-on-insulator structure having a uniform thickness. After a thin epitaxial layer is formed on a silicon substrate, ions are implanted into the epitaxial layer in order to form a thin buried etch-stop layer therein. The buried layer has etching characteristics which differ from those of the epitaxial layer. After bonding the epitaxial layer to a mechanical substrate, the silicon substrate and portions of the epitaxial layer overlaying the buried layer are removed. Subsequently, the remainder of the epi layer above the buried layer is removed in an etchant which does not appreciably attack the buried layer. The buried layer is then removed.

The remaining epitaxial layer has a substantially uniform thickness. This is due to the uniformity of the buried layer, which is in turn due to the uniform concentration of ions achieved during ion implantation.

BRIEF DESCRIPTION OF THE DRAWING

The foregoing and other structures and teachings of the present invention will become more apparent upon a detailed description of the best mode for carrying out the invention as rendered below. In the description to follow, reference will be made to the accompanying drawing, in which.

BEST MODE FOR CARRYING OUT THE INVENTION

Figure 1:
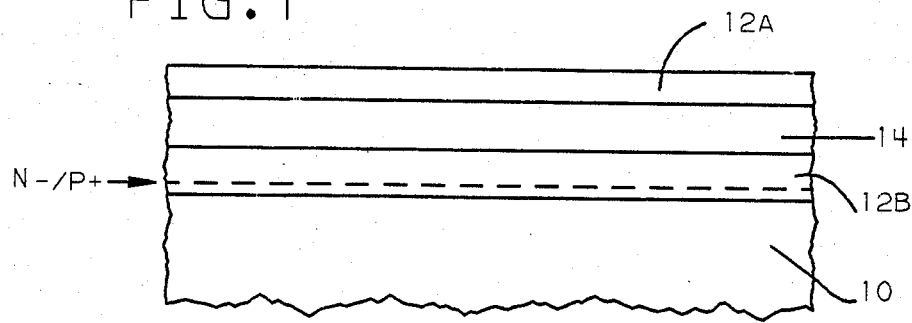
FIG. 1 is a cross-sectional view of a silicon substrate having an epitaxial layer and a buried etch stop layer.

As shown in FIG. 1, an n− epitaxial layer 12 is formed on a p+ or N+0.008 ohm/cm silicon wafer 10. The epitaxial layer 12 is grown using conventional deposition gases such as $SiH_2Cl_2$, $SiH_4$, $SiCl_4$ or $SiHCl_3$. Preferably, $SiH_2Cl_2$ is used at 1050°–1080° C. The resulting epitaxial layer can be relatively thick (e.g. 2500 nm). This is because the initial thickness of the epitaxial layer has minimal bearing upon the final thickness of the silicon-on-insulator structure, as will be described in more detail below. Note that the dopant concentration of substrate 10 should be $6 \times 10^{18}$ ions/cm$^3$ or greater, $1 \times 10^{19}$ being a typical choice. Such a concentration is necessary for this substrate to be etched in HNA. When the epitaxial layer 12 is formed on substrate 10, boron will outdiffuse from the substrate such that a p+/n− junction will be established within epitaxial layer 12. The boron atoms penetrate into the epitaxy to form the junction at approximately 400–800 nm above the physical epitaxy-substrate interface.

A buried etch-stop layer 14 is then formed within epitaxial layer 12, separating epitaxial layer 12 into a first portion 12A overlaying the etch-stop 14 and a second portion 12B laying beneath the etch-stop 14. In general, buried layer 14 can be comprised of any element which has etch characteristics that are appreciably different from those of the epitaxial layer 12. For example, buried layer 14 can be formed implanting oxygen ions at a dose of $1 \times 10^{16} - 1 \times 10^{18}$ O+ ions/cm$^2$ at 160 kev into the substrate, with the substrate being heated to approximately 500° C. The substrate is heated during implantation in order to minimize damage in the portion 12A of epitaxial layer 12 overlaying the buried ions. If oxygen ions are implanted, a buried layer of silicon oxide is formed. Note that nitrogen ions could also be used to form a buried layer of silicon nitride. In addition, carbon ions could be implanted to form a buried layer of silicon carbide. The dosage is one factor determining the "effectiveness" of the etch-stop. Specifically, the higher the dosage, the more effective the etch stop and hence the more planar the resulting epitaxial layer upon subsequent etching. This property will be discussed in more detail later. As the dosage increases, a thinner portion of region 12A is left free of defects. Doses of $4 \times 10^{16}$ ions/cm$^2$ and $1 \times 10^{17}$ ions/cm$^2$ have produced good results, with the latter being preferred. Finally, the implantation energy also affects the position of the ions within epitaxial layer 12. In general, implantation energies of 80 kev and up (160 kev being preferred) can be used.

Since buried layer 14 is formed by implantation, it has a thickness which is substantially uniform due to the minimal deviation of the implant energy. In addition, layer 14 is relatively planar (i.e. the upper surface of layer 14 is buried below the exposed surface of the epi layer at the same depth across the entire wafer).

Figure 2:
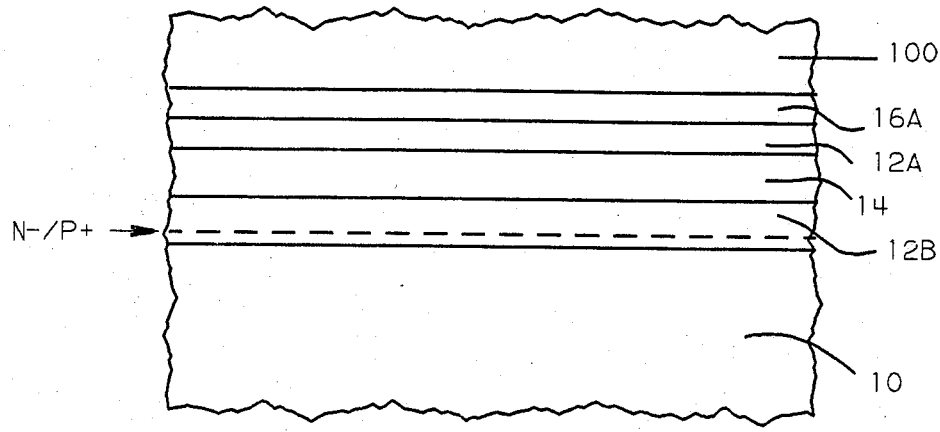
FIG. 2 is a cross-sectional view of the substrate of FIG. 1 bonded to a mechanical support utilizing a first bonding technique substrate.

Any one of a number of known bonding techniques can be used to bond substrate 10 to a "mechanical" (i.e. physical support) wafer 100. In a preferred bonding technique as shown in FIG. 2, a layer of silicon dioxide 16A is grown on epitaxial portion 12A. The thickness of this oxide layer 16A can vary in the range of approximately 10–2000 Å, with the upper limit being the amount of epitaxial portion 12A consumed during oxide growth. Preferably, $SiO_2$ 16A is 450 Å in thickness, and is grown in an oxygen ambient at approximately 800° C. Alternatively, $SiO_2$ may be pyrolytically deposited upon epitaxial portion 12A, eliminating silicon consumption. In either case, the oxide layer 16A is then bonded to the mechanical wafer 100 by contact in a steam ambient and heating to a temperature within the range of 700°–1200° C. (preferably 900° C.) for approximately 50 minutes.

Figure 3:
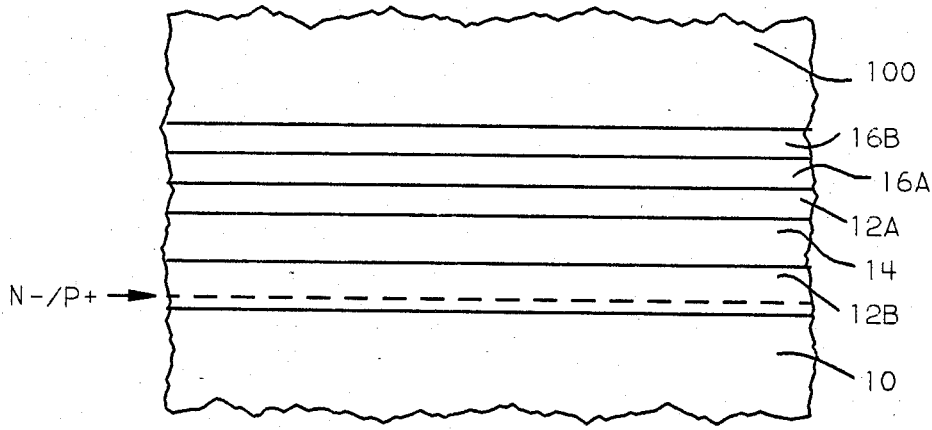
FIG. 3 is a cross-sectional view of the substrate of FIG. 1 bonded to a mechanical support substrate utilizing a second bonding technique.

In another bonding technique as shown in FIG. 3, an oxide layer 16B of any thickness (e.g. up to 20,000 Å) is grown on mechanical substrate 100 prior to bonding. Thus, the oxide layers 16A and 16B bond together, forming a very thick oxide layer. Such a thick oxide may be advantageous in high voltage applications.

Figure 4:
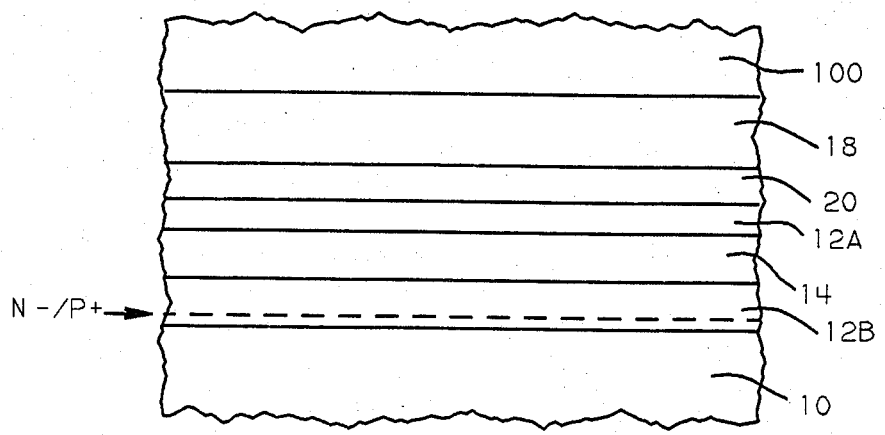
FIG. 4 is a cross-sectional view of the substrate of FIG. 1 bonded to a mechanical support substrate utilizing a third bonding technique.

In yet another technique as shown in FIG. 4, a reflowable glass such as borosilicate glass (BSG) or borophosphosilicate glass (BPSG) layer 18 is used instead of silicon dioxide. When the glass is deposited on epitaxial portion 12A, it is advisable to first deposit a 50–1000 Å (typically 200 Å) thick layer of silicon nitride 20. The nitride will prevent outdiffusion of impurities from the glass into epitaxial portion 12A during subsequent high temperature processing. Note that when bonding takes place, the bonding temperature must be above the glass transition temperature. For example, using a 4:4:92 BPSG layer of 0.4 μm thickness, bonding is carried out in a steam atmosphere at approximately 900° C. Alternatively, a layer of reflowable glass could also be formed on the mechanical substrate 100.

Figure 5:
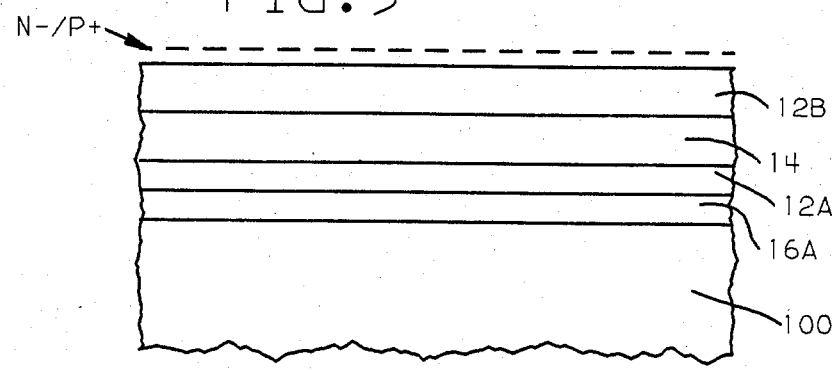
FIG. 5 is a cross-sectional view of the mechanical support substrate with the first substrate removed.

After any of the above bonding operations, p+ substrate 10 is removed to expose epitaxial portion 12B. The resulting structure is shown in FIG. 5. One removal method is to grind or lap (or otherwise mechanically remove) a substantial portion of substrate 10, mechanically polish the surface in order to remove scratches, and then etch the remaining portions of substrate 10 in a 1:3:8 solution of hydroflouric, nitric and acetic acids (HNA) plus a small amount of hydrogen peroxide. The HNA etchant will remove the remainder of substrate 10, as well as the region of epitaxial portion 12B overlaying the n− epi/p+ substrate junction produced by the outdiffusion of boron from substrate 10 into epitaxial layer 12. It has been found that by ultrasonically agitating the HNA, the by-products of the etch can be removed more efficiently, enhancing the etch selectivity (i.e. etching will cease at the p+/n− junction). With starting thicknesses of 2500 nm for the epitaxial layer 12 and 450Å for oxide layer 16A, the combined thickness of layers 12A, 12B and 14 is typically 2200±200 nm after HNA etching. Substrate 10 is initially mechanically removed in order to reduce total processing time. That is, an alternative to the first removal method is to cover the exposed surfaces of both of the substrates with a thermal silicon dioxide layer, and to remove the thermal silicon dioxide layer from substrate 10 using an etchant such as hydroflouric acid. The substrate 10 is then removed using an etch which has a high etch rate ratio of silicon to silicon dioxide. An example of such an etchant is ethylene-diamine-pyrocatechol (EDP). Thus, the oxide layer atop mechanical substrate 100 protects it during EDP etching of substrate 10, thus eliminating the need for the mechanical removing step.

The remainder of epitaxial layer 12B is then removed using an etchant which has a high selectivity of silicon to silicon oxide (or silicon to silicon nitride, in the case where the etch-stop is comprised of silicon nitride). Preferably, this etch is carried out using ethylene-piperidine-pyrocatechol (EPP) at 70°–130° C. The inventors have determined that by using EPP, a 6 micron etch-stop "effectiveness" can be achieved with a buried oxide layer 14 having a oxygen ion concentration of $1 \times 10^{17}$ ion/cm$^2$. The "effectiveness" of the etch-stop can be explained as follows. Assume for the moment that after HNA etching the remaining region of epitaxial portion 12A has a thickness which varies up to 6 microns. When EPP etching is completed, this variation is eliminated, such that a uniform thickness of the etch-stop layer 14 remains. This improvement in planarity is yet another of the advantages of using an implanted etch-stop as in the invention.

Other etchants could be used to remove the epitaxial portion 12B. One such etchant is 3 molar potassium hydroxide (KOH) heated to 35°–50° C. However, tests have shown that when using this etchant, an oxide layer having a concentration of $1 \times 10^{17}$ oxygen ions/cm$^2$ achieves an effectiveness of only 1 micron. Therefore, EPP (as well as similar etchants such as ethylene-diamine-pyrocatechol) is preferable to KOH, given the dopant oxygen (or nitrogen) ion concentrations mentioned previously.

Then, etch-stop 14 is removed. Any etchant which has a high etch rate ratio of silicon oxide to silicon could be used. Alternatively, the layer may be etched in a non-selective etch such as CF$_4$+O$_2$ plasma.

Figure 6:
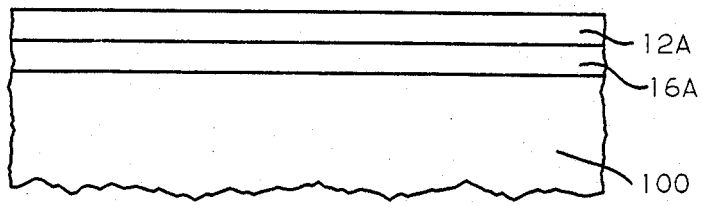
FIG. 6 is a cross-sectional view of the second substrate as shown in FIG. 5 with the overlaying portions of the epitaxial layer and the buried etch stop layer removed.

The final structure is shown in FIG. 6. The remaining portion of the epitaxial layer 12 is substantially planar, and thus is of a substantially uniform thickness. As previously noted, this is due to the uniform distribution achieved by the oxygen ions during the implantation to form the buried etch-stop layer 14. If it is desired to reduce the thickness of 12A further, this may be done by oxidation and subsequent etching in BHF. Measurements have shown that the thickness of the remaining portion of epitaxial layer 12 is approximately 350±4 nm, which is quite an improvement over the 250±150 nm achieved with an initial epitaxial thickness of 2500 nm and the methods of the prior art as discussed previously. If needed, the remaining epitaxial layer may be oxidized and etched, or directly etched, in order to remove any residual oxide left over from etch-stop 14.

An alternate embodiment of present invention is to form the etch-stop 14 by implanting boron ions into the epitaxy. An n− epitaxial layer is formed on a p+ substrate as in the first embodiment above. Prior to boron implantation, an oxide layer (typically 500 nm thick) is grown on the epi, in order to minimize thermal processing after implantation is done. Then boron ions at a dose of $6 \times 10^{14}$ ions/cm$^2$ at 2.0 Mev are implanted through the oxide to form a buried boron etch-stop layer. A mechanical substrate is then bonded to the oxide, and the first substrate is removed in ultrasonically agitated HNA, as in the first embodiment. Then the epitaxy is etched in 3 molar KOH at approximately 50° C., to the point where the peak boron concentration in the implanted etch-stop is reached. Finally, the remainder of the etch-stop is removed using HNA. That is, since the peak boron concentration is above that needed to initiate HNA etching (i.e. $4 \times 10^{18}$ ions/cm$^2$), HNA etching can be initiated. Once initiated, it can be continued to remove the remainder of the etch-stop even though the boron concentration falls below this critical concentration. Note that the distance of this second etch-stop from the thermally grown oxide is formed by ion implantation and hence is substantially uniform.

Both embodiments of the invention as described above results in a thin, uniformly thick silicon layer above an insulator. The final thickness of this layer is independent of the thickness of the epitaxial layer as initially grown.

It is to be understood that while modifications can be made to the structures and teachings of the present invention as described above, such modifications fall within the spirit and scope of the present invention as specified in the claims appended hereto.

We claim:

1. A method of forming a thin semiconductor layer of substantially uniform thickness upon which semiconductor structures can be subsequently formed, comprising the steps of:
   forming layer of silicon upon a silicon substrate;
   implanting ions into said silicon layer in order to form a buried layer therein, said buried layer having etch characteristics which differ from those of said silicon layer;
   bonding said silicon layer to a mechanical substrate;
   removing said silicon substrate and portions of said silicon layer between said silicon substrate and said buried layer; and
   removing said buried layer without removing underlaying portions of said silicon layer,
   whereby said underlaying portions of said silicon layer remain on said mechanical substrate to form the thin semiconductor layer.

2. The method as recited in claim 1, wherein said silicon substrate is of a first conductivity type and said silicon layer is of a second conductivity type.

3. The method as recited in claim 1, wherein said ions comprise oxygen ions, such that said buried layer is comprised of silicon oxide.

4. The method as recited in claim 1, wherein said ions comprise nitrogen ions, such that said buried layer is comprised of silicon nitride.

5. The method as recited in claim 1, wherein said ions comprise carbon ions, such that said buried layer is comprised of silicon carbide.

6. The method of claim 1, wherein said substrate is heated to approximately 500° C. during said implantation.

7. The method as recited in claim 1, wherein said step of bonding said epitaxial layer to a mechanical substrate comprises the steps of:
forming a layer of silicon dioxide on an exposed surface of said silicon layer;
bringing said layer of silicon dioxide and said mechanical substrate into contact; and
heating said silicon dioxide layer and said mechanical substrate in order to form a bond therebetween.

8. The method as recited in claim 7, wherein said heating step is carried out at a temperature between approximately 700° C.-1200° C. in an oxidizing ambient.

9. The method as recited in claim 7, wherein a second layer of silicon dioxide is grown on said mechanical substrate, such that said silicon dioxide layer formed on said silicon layer contacts said second layer of silicon dioxide during said bonding step.

10. The method as recited in claim 1, wherein said step of bonding said epitaxial layer to a mechanical substrate comprises the steps of:
forming a layer of silicon nitride on an exposed surface of said silicon layer;
forming a glass layer on said silicon nitride layer;
bringing said glass layer and said mechanical substrate into contact; and
heating said glass layer above its glass transition temperature in order to form a bond to said mechanical substrate.

11. The method as recited in claim 10, wherein said glass layer is heated to approximately 900° C.

12. The method as recited in claim 10, wherein said glass layer is selected from the group consisting of phosphosilicate glass and boro-phosphosilicate glass.

13. The process as recited in claim 2, wherein said step of removing said silicon substrate and portions of said epitaxial layer overlaying said buried layer comprises the steps of:
mechanically removing a portion of said silicon substrate;
etching remaining portions of said silicon substrate and a part of said portion of said epitaxial layer between said silicon substrate and said buried region in a first etchant which does not appreciably attack a remaining part of said portion of said silicon layer between said silicon substrate and said buried region; and
etching said remaining part of said portion of said silicon layer between said silicon substrate and said buried region in a second etchant which does not appreciably attack said buried layer.

14. The process as recited in claim 13, wherein said first etchant comprises a solution of hydroflouric, nitric and acetic acids.

15. The process as recited in claim 14, wherein said first etchant further comprises hydrogen peroxide.

16. The process as recited in claim 15, wherein said first etchant is ultrasonically agitated.

17. The process as recited in claim 13, wherein said second etchant comprises a solution selected from the group consisting of ethylene-diamine-pyrocatecol, ethylene-piperidine-pyrocatechol, and potassium hydroxide.

18. The process as recited in claim 1, wherein said step of removing said buried layer is performed by oxidation and subsequent etching using hydroflouric acid as an etchant.

19. The process as recited in claim 1, wherein said step of removing said buried layer is performed by etching in a $CF_4 + O_2$ plasma.

20. The process as recited in claim 1, wherein said ions are implanted at a concentration within the range of $1 \times 10^{16} - 1 \times 10^{18}$ ions/cm$^2$ and at an energy of approximately 160 kev.

21. A method of forming a thin semiconductor layer of substantially uniform thickness upon which semiconductor structures may be subsequently formed, comprising the steps of:
growing an silicon layer of a second conductivity type upon a silicon substrate of a first conductivity type;
implanting ions into said epitaxial layer in order to form a substantially planar buried layer of substantially uniform thickness therein, said buried layer having etch characteristics which appreciably differ from those of said epitaxial layer;
bonding said epitaxial layer to a mechanical substrate;
removing said semiconductor substrate and a portion of said epitaxial layer in an etchant which attacks silicon of said first conductivity type while not appreciably attacking silicon of said second conductivity type;
etching remaining portions of said epitaxial layer overlaying said buried layer in an etchant which does not appreciably attack underlaying portions of said buried layer; and
etching said buried layer in an etchant which does not appreciably attack underlaying portions of said epitaxial layer, said underlaying portions of said epitaxial layer remaining on said mechanical substrate to form the thin semiconductor layer.

22. The method as recited in claim 21, wherein said ions comprise oxygen ions which are implanted at a concentration within the range of $1 \times 10^{16} - 1 \times 10^{18}$ ions/cm$^2$ at an energy of 160 kev, said ions reacting with said epitaxial layer such that said buried layer is comprised of silicon oxide.

23. The method as recited in claim 21, wherein:
said first etchant comprises a solution of hydroflouric, nitric and acetic acids, and hydrogen peroxide, which is ultrasonically agitated in order to improve selectivity; and
said second etchant comprises a solution selected from the group consisting of ethylene-diamine-pyrocatechol acid and ethylene-piperidine-pyrocatechol acid.

24. The process as recited in claim 21, wherein prior to said step of removing said semiconductor substrate, a protective layer of silicon dioxide is formed on a surface of said mechanical substrate which remains exposed after said bonding step.

25. A method for forming a thin silicon-on-insulator structure, comprising:

forming a silicon layer of a first conductivity type on a first semiconductor wafer of a second conductivity type establishing a N/P junction therewith within said silicon layer;

implanting into a portion of said silicon layer ions of a material which has different etching characteristics than the adjoining first portions of said silicon layer, to form a buried layer;

forming a silicon dioxide layer on said silicon layer, and bonding onto said silicon dioxide layer a second semiconductor wafer;

removing said first semiconductor wafer and a portion of said silicon layer disposed between said first semiconductor layer and said buried layer with a first etchant which attacks silicon of said first conductivity type without attacking silicon of said second conductivity type, so as to expose said N/P junction;

removing a remainder of said portion of said silicon layer disposed between said first semiconductor layer and said buried layer with a second etchant that stops appreciable etching at said buried layer; and removing said buried layer with a third etchant which stop etching at the underlaying unimplanted portion of said silicon layer, thereby resulting in a thin sliicon layer of a predetermined uniform thickness atop a silicon diioxide layer which is atop said second semiconductor wafer.

26. A method of forming a silicon-on-insulator structure, comprising the steps of:

growing an epitaxial layer of a second conductivity type on a silicon substrate of a first conductivity type in order to form a N/P junction therewith within said epitaxial layer;

forming a silicon dioxide layer on an exposed surface of said epitaxial layer;

implanting dopant ions through said silicon dioxide layer into said epitaxial layer in order to form a buried layer of said first conductivity type within said epitaxial layer;

bonding said silicon substrate to a mechanical substrate, using said silicon dioxide layer as a bonding material;

removing said silicon substrate and portions of said epitaxial layer between said silicon substrate and said N/P junction with a first etchant which does not appreciably attack silicon of said second conductivity type;

removing portions of said epitaxial layer between said N/P junction and a peak concentration of said dopant ions within said buried layer with a second etchant; and removing remaining portions of said buried layer with said of first etchant, remaining portions of said epitaxial layer overlaying said silicon dioxide layer to form the silicon-on-insulator structure.

27. The method as recited in claim 26, wherein said dopant ions comprise boron, which is implanted at a concentration of approximately $6 \times 10^{14}$ ions/cm$^2$ at an energy of approximately 2.0 Mev.

* * * * *